US010790621B2

United States Patent
Ito (10) Patent No.: US 10,790,621 B2
(45) Date of Patent: Sep. 29, 2020

(54) PORTABLE ELECTRONIC DEVICE

(71) Applicant: Murata Manufacturing Co., Ltd., Kyoto-fu (JP)

(72) Inventor: Kenichi Ito, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/598,169

(22) Filed: Oct. 10, 2019

(65) Prior Publication Data

US 2020/0044396 A1  Feb. 6, 2020

Related U.S. Application Data

(63) Continuation of application No. PCT/JP2018/008923, filed on Mar. 8, 2018.

(30) Foreign Application Priority Data

May 18, 2017 (JP) ................................ 2017-098978

(51) Int. Cl.
*H01R 12/72* (2011.01)
*H01R 13/6594* (2011.01)
(Continued)

(52) U.S. Cl.
CPC ....... *H01R 13/6594* (2013.01); *H01R 12/722* (2013.01); *H01R 24/60* (2013.01);
(Continued)

(58) Field of Classification Search
CPC .............. H01R 13/658; H01R 31/6581; H01R 13/6582; H01R 12/716; H01R 12/724; H01R 13/5213; H05K 9/0067
See application file for complete search history.

(56) References Cited

U.S. PATENT DOCUMENTS 5,473,109 A  *  12/1995  Plankl ................. H05K 5/0047
                                                174/363
6,066,002 A       5/2000  Sterckx et al.
(Continued)

FOREIGN PATENT DOCUMENTS

CN       101330164 A    12/2008
CN       103140993 A     6/2013
(Continued)

OTHER PUBLICATIONS

International Search Report issued in PCT/JP2018/008923; dated Apr. 17, 2018.
(Continued)

*Primary Examiner* — Tho D Ta
(74) *Attorney, Agent, or Firm* — Studebaker & Brackett PC (57) ABSTRACT

A portable information communications terminal includes a wiring board on which a ground pattern is formed, a connector including connector pins and mounted on the wiring board, a housing that has electrical conductivity and accommodates the wiring board on which the connector is mounted, an electroconductive connector shell (first shield member) that covers at least a portion of the connector pins, which are included in the connector, and that is electrically connected to the ground pattern of the wiring board, an electroconductive second shield member that is disposed so as not to be in contact with the connector shell and to cover the connector pins including a portion of the connector pins, the portion being not covered with the connector shell. The electroconductive second shield member is electrically connected to the housing, and an insulating member is interposed between the connector shell and the second shield member.

16 Claims, 7 Drawing Sheets

(51) Int. Cl.
  *H01R 24/60* (2011.01)
  *H01R 13/6582* (2011.01)
  *H01R 13/658* (2011.01)
  *H01R 13/52* (2006.01)
  *H05K 9/00* (2006.01)
  *H01R 12/71* (2011.01)
  *H01R 13/6581* (2011.01)

(52) U.S. Cl.
  CPC .......... *H01R 12/716* (2013.01); *H01R 12/724* (2013.01); *H01R 13/5213* (2013.01); *H01R 13/658* (2013.01); *H01R 13/6581* (2013.01); *H01R 13/6582* (2013.01); *H05K 9/0067* (2013.01)

(56) References Cited

U.S. PATENT DOCUMENTS

| | | | | |
|---|---|---|---|---|
| 6,276,965 | B1* | 8/2001 | Madsen | H01R 13/6582 439/607.01 |
| 7,269,033 | B2* | 9/2007 | Berberich | H01R 13/6625 361/761 |
| 7,651,345 | B2* | 1/2010 | Tomioka | H01Q 1/2258 439/573 |
| 8,149,594 | B2* | 4/2012 | Nishihata | H05K 9/002 174/250 |
| 9,004,945 | B2* | 4/2015 | Nagata | H01R 13/6594 439/607.35 |
| 9,178,314 | B2* | 11/2015 | Dickens | H01R 13/6461 |
| 9,578,767 | B2* | 2/2017 | Gingrich | H01R 13/6581 |
| 2008/0318447 | A1 | 12/2008 | Tomioka et al. | |
| 2013/0178100 | A1 | 7/2013 | Nagata et al. | |

FOREIGN PATENT DOCUMENTS

| | | |
|---|---|---|
| JP | H05-015370 U | 2/1993 |
| JP | H08-203617 A | 8/1996 |
| JP | 2000-513486 A | 10/2000 |
| JP | 2008-311134 A | 12/2008 |
| JP | 2012-49926 A | 3/2012 |
| JP | 2012-74223 A | 4/2012 |
| JP | 2016-12420 A | 1/2016 |
| JP | 2016-134319 A | 7/2016 |

OTHER PUBLICATIONS

International Preliminary Report on Patentability and Written Opinion issued in PCT/JP2018/008923; dated Nov. 19, 2019.

An Office Action; "Decision of Refusal," mailed by the Japanese Patent Office dated Aug. 11, 2020, which corresponds to Japanese Patent Application No. 2019-519079 and is related to U.S. Appl. No. 16/598,169 with English language translation.

An Office Action mailed by the China National Intellectual Property Administration dated Jul. 15, 2020, which correspond to Chinese Patent Application No. 201880032873.7 and is related to U.S. Appl. No. 16/598,169 with English language translation.

* cited by examiner

[FIRST COMPARATIVE EXAMPLE]

FIG. 7

[SECOND COMPARATIVE EXAMPLE]

PORTABLE ELECTRONIC DEVICE

CROSS-REFERENCE TO RELATED APPLICATIONS

This application claims benefit of priority to International Patent Application No. PCT/JP2018/008923, filed Mar. 8, 2018, and to Japanese Patent Application No. 2017-098978, filed May 18, 2017, the entire contents of each are incorporated herein by reference.

BACKGROUND

Technical Field

The present disclosure relates to a portable electronic device.

Background Art

In general, various connectors are used in electronic devices in order to connect the electronic devices to external devices and the like. Japanese Unexamined Patent Application Publication No. 2016-134319 discloses an external interface connector to which a connection cable that is used for data communication between electronic devices is to be connected and that is capable of being reduced in size without reducing the pitch of connection terminals even if the number of connection pins is increased.

More specifically, the external interface connector is divided into two parts, which are a first interface connector that is mounted on the front surface of a circuit board and a second interface connector that is mounted on the rear surface of the circuit board, and the single external interface connector is formed as a result of the first interface connector and the second interface connector being mounted on the circuit board.

In addition, in the external interface connector, the above-mentioned first interface connector includes a shell cover made of a metal and a holder made of a resin, and the shell cover is grounded to the ground of the circuit board so as to serve as a shield (i.e., the shell cover shields the external interface connector).

SUMMARY

In recent years, for example, with the reduction in the sizes and the thicknesses of portable electronic devices, such as portable information communications terminals, the improvement in the driving speeds of the portable electronic devices, and so forth, there has been a problem of a phenomenon, or so-called self-poisoning, in which noise generated by a digital circuit in such a portable electronic device enters a receiving circuit via an antenna, so that the receiving sensitivity is degraded. In particular, for example, when a connector and an antenna are arranged close to each other, there is a possibility that noise that is emitted by the connector (connector pins) may enter a receiving circuit via the antenna, so that the receiving sensitivity may be degraded. Accordingly, it is desired to further improve a shielding effect against the noise emitted by the connector (the connector pins).

Accordingly, the present disclosure provides a portable electronic device capable of further improving a shielding effect of a connector (connector pins).

A portable electronic device according to the present disclosure includes a wiring board on which a ground pattern is formed, a connector that includes a plurality of connector pins and that is mounted on the wiring board, a housing that has electrical conductivity and accommodates the wiring board on which the connector is mounted, an electroconductive first shield member that covers at least a portion of the plurality of connector pins, which are included in the connector, and that is electrically connected to the ground pattern of the wiring board, and an electroconductive second shield member. The electroconductive second shield member is disposed so as not to be in contact with the first shield member and so as to cover the plurality of connector pins including a portion of the plurality of connector pins, with the portion being not covered with the first shield member, and is electrically connected to the housing.

According to the present disclosure, a shielding effect of a connector that is included in a portable electronic device can be further improved.

DETAILED DESCRIPTION

A preferred embodiment of the present disclosure will be described in detail below with reference to the drawings. Note that, in the drawings, the same elements are denoted by the same reference signs, and repeated descriptions will be omitted.

Figure 1:
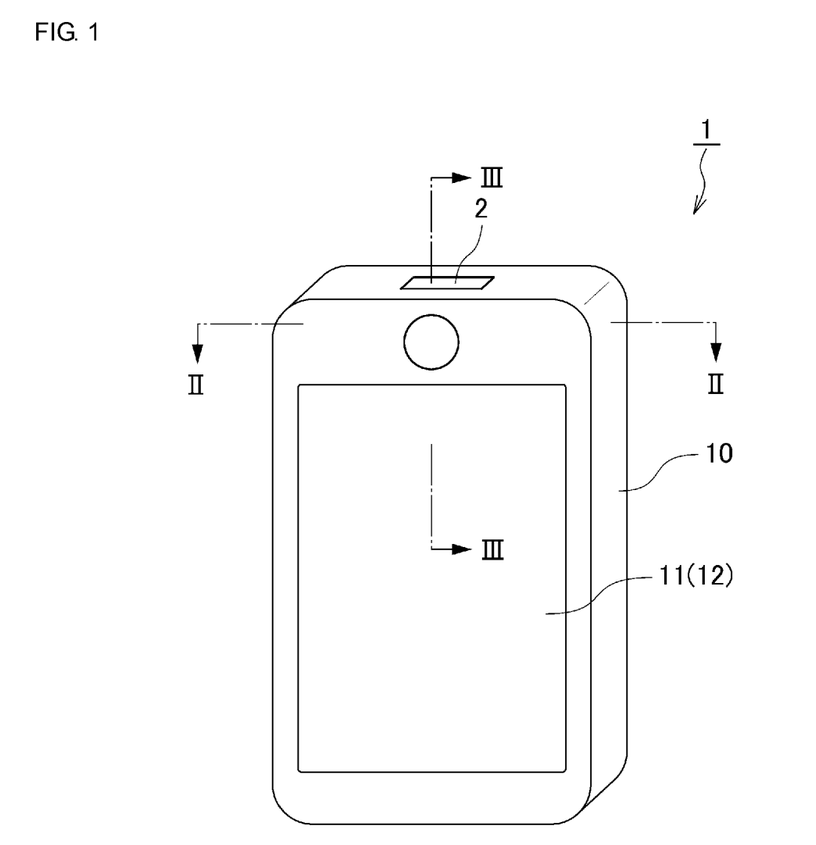
FIG. 1 is a perspective view illustrating a portable electronic device (a portable information communications terminal) according to an embodiment of the present disclosure.
Figure 2A:
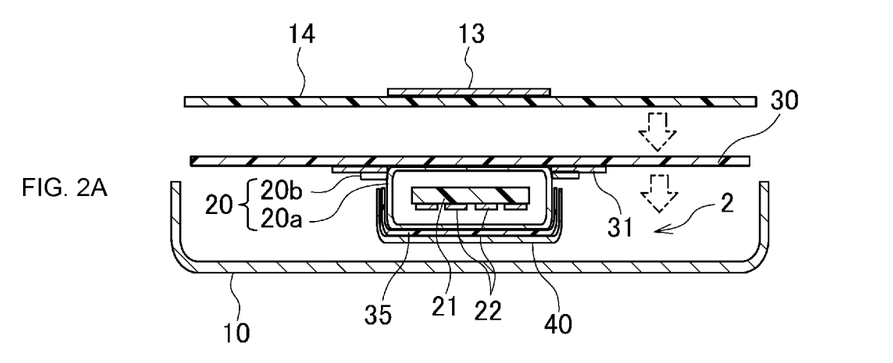
FIGS. 2A and FIG. 2B are cross-sectional views (cross-sectional views taken along line II-II of FIG. 1) each illustrating a shield structure of a connector according to the embodiment, with FIG. 2A illustrating a state before a wiring board is accommodated in a housing, and FIG. 2B illustrating a state after the wiring board has been accommodated in the housing.
Figure 2B:
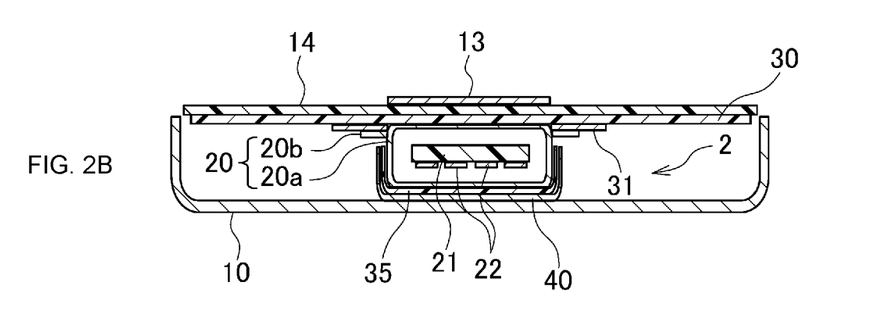
Figure 3A:
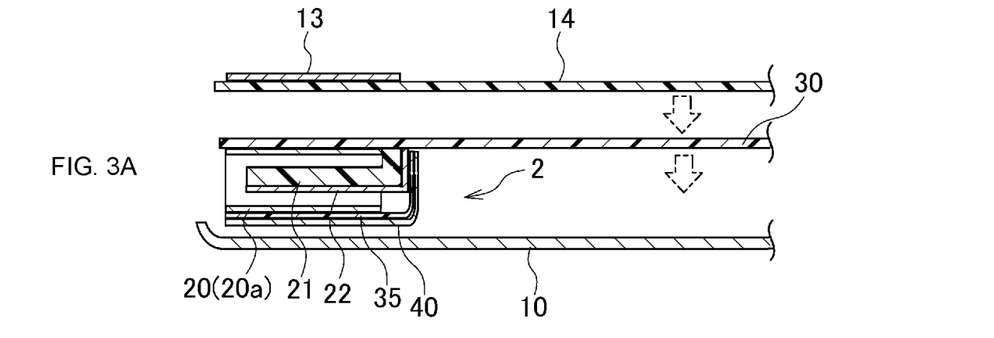
FIG. 3A and FIG. 3B are cross-sectional views (cross-sectional views taken along line of FIG. 1) each illustrating the shield structure of the connector according to the embodiment, with FIG. 3A illustrating a state before the wiring board is accommodated in the housing, and FIG. 3B illustrating a state after the wiring board has been accommodated in the housing.
Figure 3B:
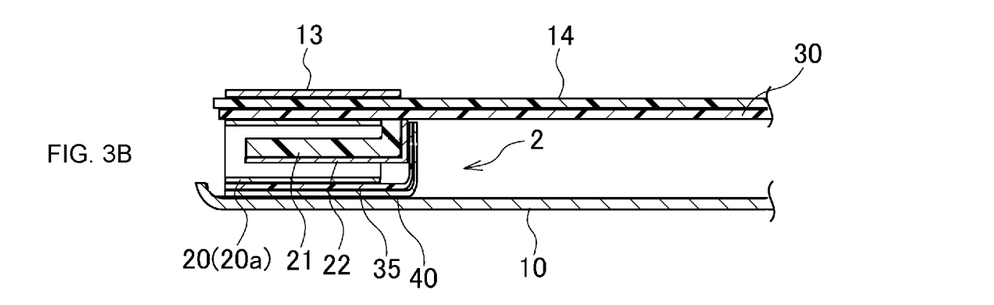

A shield structure of a connector 2 according to the embodiment will be described first with reference to FIGS. 1 to FIG. 3B. FIG. 1 is a perspective view illustrating a portable electronic device (portable information communications terminal) 1 to which the shield structure of the connector 2 is applied. FIGS. 2A and FIG. 2B are cross-sectional views (cross-sectional views taken along line II-II of FIG. 1) each illustrating the shield structure of the connector 2, with FIG. 2A illustrating a state before a wiring board is accommodated in a housing, and FIG. 2B illustrating a state after the wiring board has been accommodated in the housing. Similarly, FIG. 3A and FIG. 3B are cross-sectional views (cross-sectional views taken along line of FIG. 1) each illustrating the shield structure of the connector 2, with FIG. 3A illustrating a state before the wiring board is accommodated in the housing, and FIG. 3B illustrating a state after the wiring board has been accommodated in the housing. Note that, as an example, a portable information communications terminal (a smartphone) will be described in the present embodiment as the portable electronic device 1.

The portable information communications terminal 1 (corresponding to a portable electronic device described in the claims) is, for example, an information terminal that has a phone-call function, an e-mail transmission/reception function, a Web (Internet) browsing function, an image (still image, moving image) viewing function, a music playback function, an imaging (camera) function, and so forth. As illustrated in FIG. 1, the portable information communications terminal 1 has a thin, substantially rectangular parallelepiped shape, and a sheet-shaped liquid crystal panel (LCD display) 11 and a touch panel 12 are attached to the front surface of the portable information communications terminal 1 so as to be stacked one on top of the other. For example, the liquid crystal panel 11 displays textual information, image information, an input operation screen, and so forth. The touch panel 12 detects a touch operation (an input operation) performed by using a hand (a digit). For example, an electrostatic capacitance method, a resistive film method, or the like may be employed for detecting such a touch operation.

The portable information communications terminal 1 includes a wireless communication antenna 13 that is used for transmitting and receiving the above-mentioned information to and from an external device (e.g., a base station or the like) by wireless communication and a connector (receptacle) 2 that is used for transmitting and receiving information to and from an external device by wired communication. Note that details of this matter will be described later.

A housing 10 of the portable information communications terminal 1 is made of, for example, an electroconductive material such as a metal and formed in a thin, substantially rectangular parallelepiped shape. Here, the housing 10 itself may be made of an electroconductive material such as a metal, or the housing 10 may be formed by, for example, attaching a thin film having electrical conductivity to a material such as a resin that does not have electrical conductivity or by applying an electroconductive coating to a material such as a resin that does not have electrical conductivity.

An inner lid 14 that is illustrated in FIG. 2A to FIG. 3B is provided on the rear surface side of the liquid crystal panel 11 (inside the housing 10). The above-mentioned antenna 13 that transmits and receives radio waves is attached to an end portion of the inner lid 14. Note that the antenna 13 is, for example, a long term evolution (LTE) antenna and is connected to a wiring board 30. The wiring board 30 on which the connector 2 has been mounted, a battery pack (not illustrated), and so forth are accommodated on the rear surface side of the inner lid 14 (inside the housing 10).

For example, the wiring board 30 is formed by laminating a plurality of insulating layers on which wiring patterns (including a ground pattern, a power-supply pattern, and a signal pattern) are formed. Each of the insulating layers is, for example, a rectangular thin plate made of flame retardant type 4 (FR-4). The wiring patterns are each made of, for example, a copper foil or the like.

For example, an electronic circuit that has a baseband processor and performs communication processing, an electronic circuit that has an application processor and processes (runs) various application software, and so forth are mounted on the wiring board 30.

The connector (receptacle) 2 is mounted on an end portion of the wiring board 30 such that a plug slot is open to a lower side surface of the housing 10. Accordingly, the connector 2 and the antenna 13 are arranged close to each other so as to be stacked one on top of the other in a thickness direction of the portable information communications terminal 1.

The connector 2 is, for example, a USB Type-C connector. The connector (receptacle) 2 includes a connector shell 20 that has a substantially rectangular cylindrical shape and that defines a plug insertion space, a plug guiding piece 21 that is disposed in the plug insertion space, and a plurality of connector pins (connection terminals) 22 that are arranged on the plug guiding piece 21 and each of which is capable of being electrically connected to a terminal of a plug.

The connector shell 20 includes a shell body 20a that has a substantially rectangular cylindrical shape and a mounting piece 20b that protrudes laterally (parallel to the wiring board 30) from the shell body 20a. As a result of the mounting piece 20b being soldered to the wiring board 30, the connector shell 20 (connector 2) is attached to the wiring board 30. In addition, as illustrated in FIGS. 3A and 3B, an end (a base end) of each of the plurality of connector pins 22 is connected to the wiring board 30. The connector shell 20 (shell body 20a) is formed into a substantially rectangular cylindrical shape by, for example, bending a single electro-conductive metal plate that has been punched out into a substantially rectangular shape.

The connector 2 has a structure that is capable of further improving a shielding effect. The shield structure of the connector 2 will now be described in detail. The shield structure of the connector 2 mainly includes the connector shell 20 that functions as a first shield member, an insulating member 35, and a second shield member 40. In this manner, in the present embodiment, the connector shell 20, which is included in the connector 2, is used as (is also used as) the first shield member.

The connector shell (first shield member) 20 has electrical conductivity as mentioned above and covers at least a portion of the plurality of connector pins 22, which are included in the connector 2. More specifically, the connector shell 20 covers, from a side, tip end portions and center portions of the plurality of connector pins 22 excluding base end portions (rear end portions) of the plurality of connector pins 22. Note that the plurality of connector pins 22 may be entirely covered with the connector shell 20 (excluding an opening). In addition, as mentioned above, the connector shell 20 is electrically connected to a ground pattern 31 of the wiring board 30 (a board ground).

For example, the second shield member 40 is formed of a metal foil (a copper foil or the like) that has electrical conductivity. The second shield member 40 is electrically connected to the housing 10 (a frame ground). (Details of this matter will be described later.) Note that, for example, the housing 10 (a frame ground) is electrically connected to the ground pattern 31 of the wiring board 30 (the board ground) at one arbitrary point.

The second shield member 40 is disposed so as to be separated from the connector shell (first shield member) 20 and so as not to be in contact with the connector shell (first shield member) 20. In addition, the second shield member 40 is disposed so as to cover the entire connector shell 20. Here, the insulating member 35 that is made of an insulating material in the form of a sheet (a thin film) is interposed between the connector shell 20 and the second shield member 40 in order to reliably prevent the connector shell 20 and the second shield member 40 from coming into contact with each other.

The second shield member 40 is provided so as to cover the plurality of connector pins 22 including portions (e.g., the rear end portions) of the plurality of connector pins 22 that are not covered with the connector shell (first shield member) 20, that is, the second shield member 40 is provided so as to cover larger areas of the connector pins 22 than the areas of the connector pins 22 covered with the connector shell (first shield member) 20. Thus, each of the connector pins 22 is entirely covered with the connector shell (first shield member) 20 and the second shield member 40 excluding an open end into which a plug is inserted.

The second shield member 40 is pressed into contact with the housing 10 (the frame ground) by being sandwiched between the connector shell 20 and the housing 10 with the insulating member 35 interposed between the second shield member 40 and the connector shell 20, so that the second shield member 40 is electrically connected to the housing 10 (the frame ground). Note that, in the present embodiment, the second shield member 40 and the housing 10 are brought into close contact with each other as a result of pressure being applied thereto by using the inner lid 14 that is made of a metal and that is provided with an insulating coating.

Figure 4:
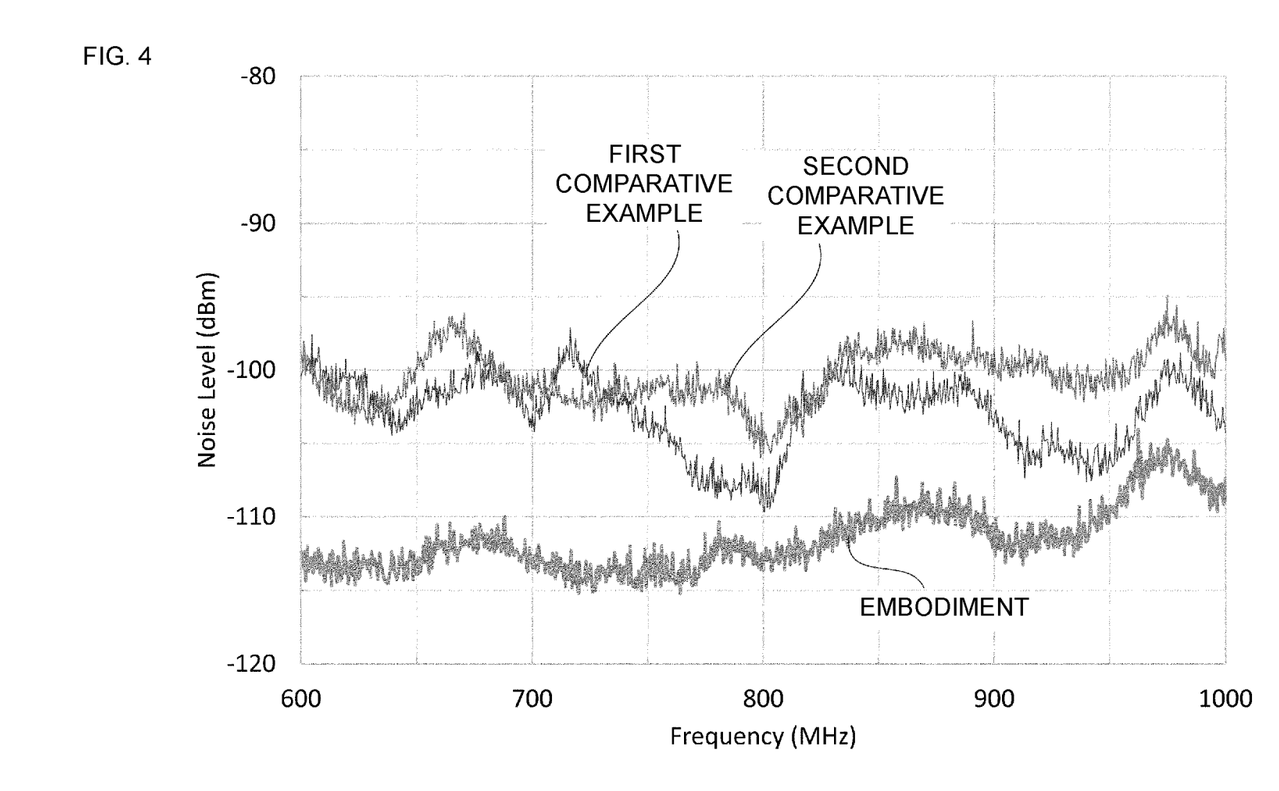
FIG. 4 is a graph illustrating measurement results of the levels of noise that is coupled to an antenna.
Figure 5:
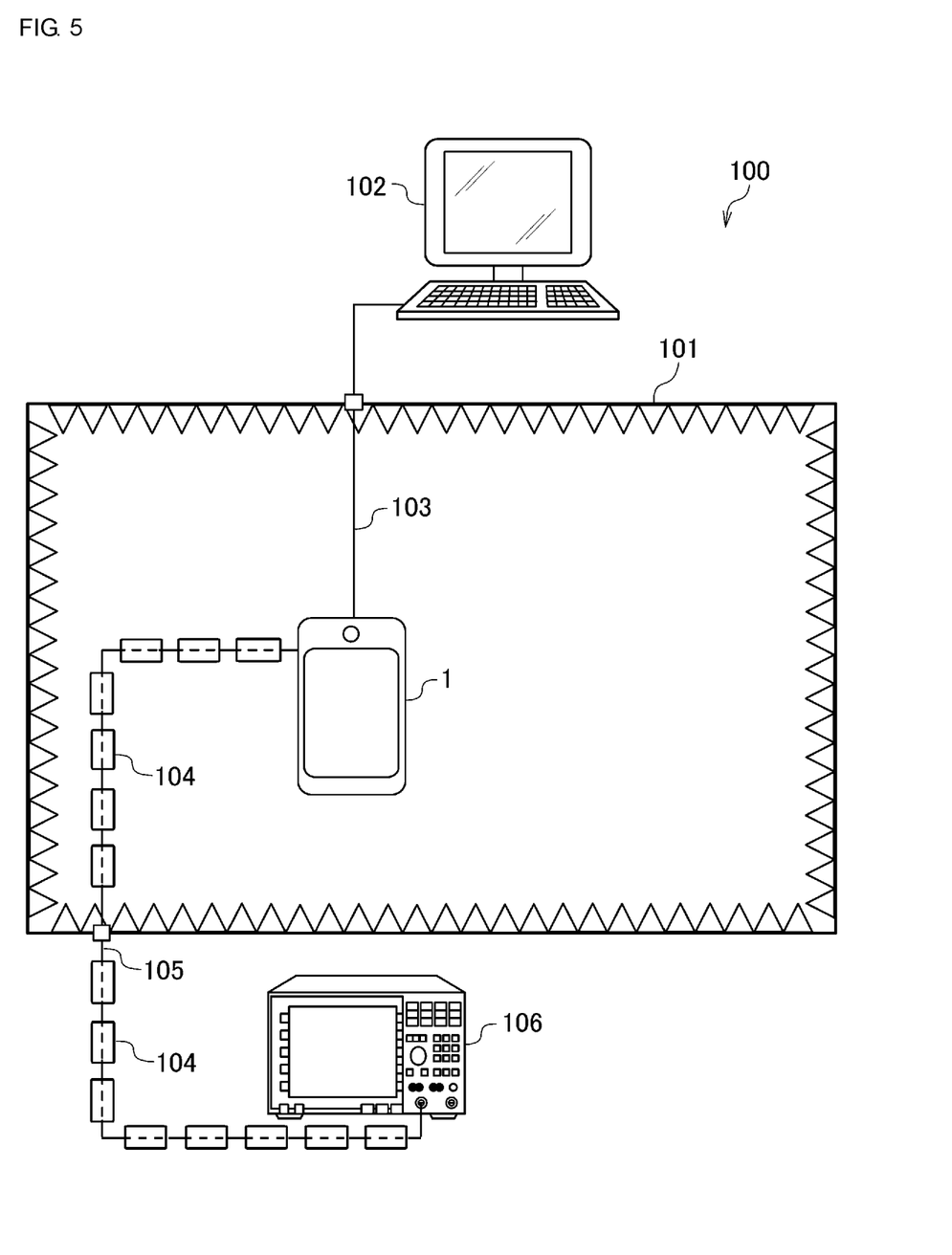
FIG. 5 is a schematic diagram illustrating a measurement system in which the levels of the noise coupled to the antenna are measured.
Figure 6:
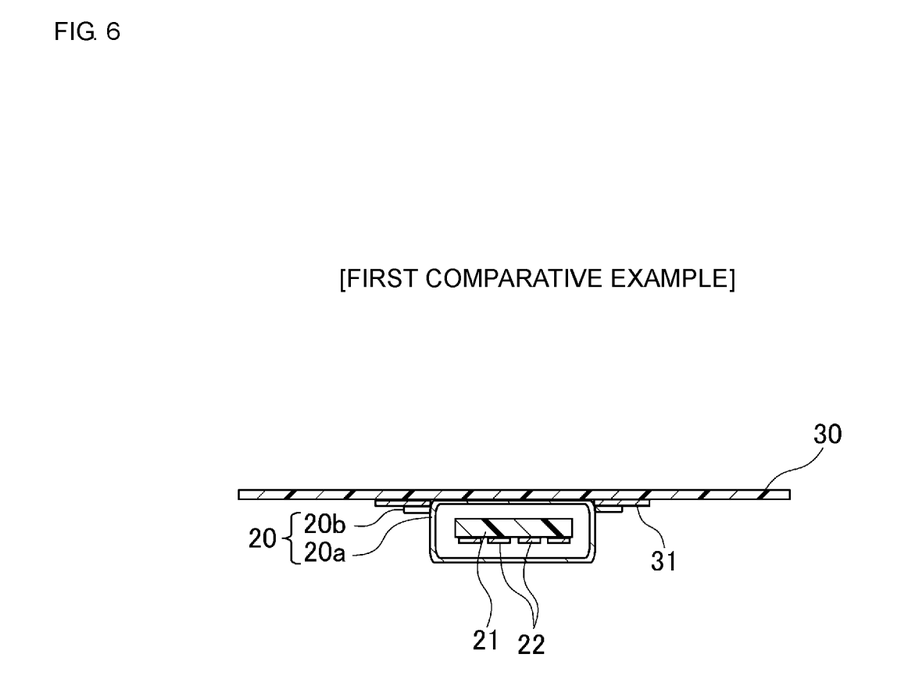
FIG. 6 is a cross-sectional view illustrating a shield structure according to a first comparative example (a case where a second shield member is not provided)
Figure 7:
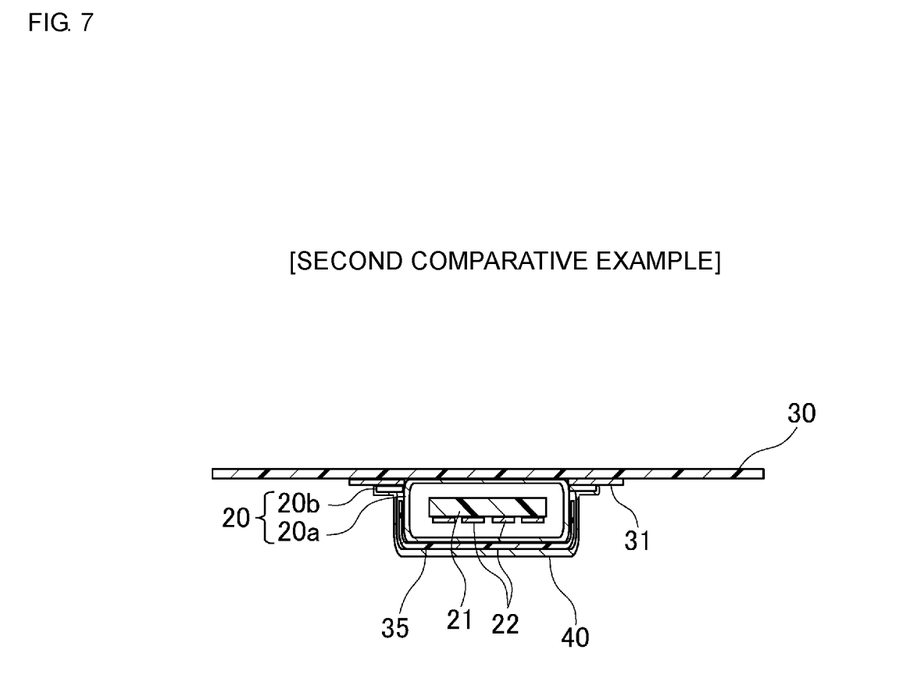
FIG. 7 is a cross-sectional view illustrating a shield structure according to a second comparative example (a case where the second shield member is connected to a board ground).

Next, noise reduction effects in the shield structure of the connector 2 according to the present embodiment and in shield structures according to comparative examples (a first comparative example and a second comparative example) will be described using measurement results and with reference to FIG. 4 to FIG. 7. Here, as one of the comparative shield structures (the first comparative example), a structure formed of only the connector shell (first shield member) 20, that is, a structure that does not include the second shield member 40 was used. This structure is illustrated in FIG. 6. In addition, as the other comparative shield structure (the second comparative example), a structure in which the second shield member 40 is connected not to the housing 10 (the frame ground) but to the ground pattern 31 of the wiring board 30 (the board ground) was used. This structure is illustrated in FIG. 7.

The presence or absence of the second shield member 40 and the differences between noise levels (the levels of noise coupled to the antenna 13) due to the difference between the grounds to which the second shield member 40 was connected (the board ground or the frame ground), that is, the shielding effect of the connector 2, was evaluated. Here, the level of noise coupled to the LTE antenna 13, which was an evaluation target, was evaluated. FIG. 4 is a graph illustrating measurement results of the level of noise coupled to the LTE antenna 13 in each of the shield structure of the connector 2 according to the present embodiment, the shield structure according to the first comparative example, and the shield structure according to the second comparative example. FIG. 5 is a diagram illustrating a measurement system 100 in which the levels of the noise coupled to the LTE antenna 13 are measured.

First, the measurement system 100 in which the levels of the noise coupled to the LTE antenna 13 are measured will be described with reference to FIG. 5. As illustrated in FIG. 5, the portable information communications terminal 1 (an EUT) that includes the LTE antenna 13 is installed in a shield room 101. The portable information communications terminal 1 is connected to a personal computer (PC) 102 that is disposed outside the shield room 101 via a USB Type-C cable 103. In contrast, the LTE antenna 13 of the portable information communications terminal 1 is connected to a spectrum analyzer 106 via a coaxial cable 105, to which a ferrite core 104 is attached.

The levels of the noise coupled to the LTE antenna 13 when the portable information communications terminal 1 communicated with the personal computer (PC) 102 by using the USB 3.1 Gen 1 were evaluated. Note that, by providing the second shield member 40, there is a case where the radiation characteristic of the LTE antenna 13 changes (e.g., the resonance frequency shifts). Thus, in the case where the second shield member 40 is provided, the radiation characteristic of the LTE antenna 13 is readjusted to the antenna characteristic in the case where the second shield member 40 is not provided (i.e., the characteristic such as the resonance frequency is adjusted to be the same as that in the case where the second shield member 40 is not provided), and then the levels of the noise were measured.

FIG. 4 illustrates the measurement results obtained by measuring, using the above-mentioned measurement system 100, the noise level when the shield structure of the connector 2 according to the present embodiment was used and the noise levels when the shield structures according to the comparative examples (the first comparative example and the second comparative example) were used. In the graph illustrated in FIG. 4, the horizontal axis denotes frequency (MHz), and the vertical axis denotes noise level (dBm).

As illustrated in FIG. 4, it was confirmed that the noise level in the shield structure of the connector 2 according to the present embodiment was reduced to be lower than each of the noise levels in the shield structures according to the comparative examples (the first comparative example and the second comparative example) by 10 (dBm) or more in the frequency range of 400 to 1,000 (MHz). This is because the connector pins 22 (included in the connector 2) were shielded by the second shield member 40 connected to the casing 10 (the frame ground) that has substantially zero potential, so that the noise emitted by the connector pins 22 (connector 2) was not coupled to the LTE antenna 13, which was disposed close to the connector 2.

Note that the noise level in the second comparative example was more increased than the noise level in the first comparative example. It is assumed that this increase in the noise level in the second comparative example occurred because the board ground of the portable information communications terminal 1 was not the earth ground potential (complete zero potential), so that the noise emitted by the connector pins 22 was conducted to the board ground, and noise was emitted by the pattern of the board ground.

According to the present embodiment, in addition to the connector shell (first shield member) 20 that has electrical conductivity, that covers at least portions (e.g., the sides of the tip end portions and the sides of the center portions) of the plurality of connector pins 22 included in the connector 2, and that is electrically connected to the ground pattern 31 of the wiring board 30, the second shield member 40 that has electrical conductivity, that is disposed so as not to be in contact with the connector shell 20, that covers the plurality of connector pins 22 including the portions (e.g., the rear end portions) of the plurality of connector pins 22 that are not covered with the connector shell 20, and that is electrically connected to the housing 10 (the frame ground) whose ground potential is more stable than the ground pattern 31 of the wiring board 30 (the board ground) is provided. Consequently, even if noise is superimposed on the connector shell (first shield member) 20, the noise is blocked by the second shield member 40, and thus, the noise (electromagnetic noise) emitted by the connector pins 22 (the connector 2) can be blocked more effectively. As a result, the shielding effect of the connector 2 can be further improved.

In particular, by employing the above-described shield structure of the connector 2, in the portable information communications terminal 1 that is used while the ground pattern 31 of the wiring board 30 is not grounded to the earth (i.e., the ground pattern 31 of the wiring board 30 is in a floating state), the shielding effect of the connector 2 can be further improved, and for example, the problem of self-poisoning can be solved effectively.

According to the present embodiment, the connector shell (first shield member) 20 is disposed so as to cover the plurality of connector pins 22, each of which has an end connected to the wiring board 30, and the second shield member 40 is disposed so as to cover the connector shell 20. Thus, the connector shell 20 and the ground pattern 31 of the wiring board 30 can be more easily connected to each other, and the second shield member 40 and the housing 10 (the frame ground) can be more easily connected to each other.

According to the present embodiment, since the sheet-shaped insulating member 35 is interposed between the connector shell (first shield member) 20 and the second shield member 40, the connector shell 20 and the second shield member 40 can be reliably prevented from coming into contact with each other.

According to the present embodiment, since the connector shell 20, which is included in the connector 2, is used as the first shield member, it is not necessary to provide an additional (dedicated) first shield member.

According to the present embodiment, the second shield member 40 is pressed into contact with the housing 10 by being sandwiched between the connector shell 20 and the housing 10 with the insulating member 35 interposed between the second shield member 40 and the connector shell 20. Thus, when connecting the second shield member 40 and the housing 10 to each other, it is not necessary to perform screwing, soldering, or the like, and for example, reduction in the manufacturing costs, reduction in the number of manufacturing steps, reduction in the number of components, improvement of waterproof performance, and so forth can be achieved. In addition, the second shield member 40 and the housing 10 can be brought into contact with each other over a larger area than in the case of performing screwing or the like, and thus, the shielding effect can be further improved.

According to the present embodiment, the noise emitted by the connector 2 (connector pins 22) can be prevented from being received by (from being coupled to) the antenna 13, which is disposed close to the connector 2. Therefore, degradation of receiving sensitivity as a result of the noise emitted by the connector 2 (connector pins 22) entering a receiving circuit via the antenna 13 (i.e., self-poisoning) can be effectively prevented from occurring.

Although the embodiment of the present disclosure has been described above, the present disclosure is not limited to the above-described embodiment, and various changes can be made. For example, in the above-described embodiment, although the second shield member 40 is pressed into contact with (connected to) the housing 10 (the frame ground) by being sandwiched between the connector shell 20 and the housing 10 with the insulating member 35 interposed between the second shield member 40 and the connector shell 20, a configuration in which the second shield member 40 and the housing 10 are brought into contact with each other by using, for example, a metal gasket, a shield finger, or the like may be employed. Alternatively, a configuration in which the second shield member 40 (the wiring board 30) is urged toward the housing 10 by, for example, a spring, a plate spring, or the like may be employed.

In the above-described embodiment, although the configuration in which the second shield member 40 covers the first shield member (connector shell) 20 is employed, a configuration in which the first shield member 20 covers the second shield member 40 may be employed.

In the above-described embodiment, although the shield structure of the connector 2 according to the present disclosure is applied to a portable information communications terminal (a smartphone), the shield structure of the connector 2 according to the present disclosure may be applied to a portable electronic device other than a portable information communications terminal. In addition, the connector 2 is not limited to a USB Type-C connector and may be a different type of connector.

What is claimed is:

1. A portable electronic device comprising:
    a wiring board on which a ground pattern is formed;
    a connector that includes a plurality of connector pins and that is mounted on the wiring board;
    a housing that has electrical conductivity and accommodates the wiring board on which the connector is mounted;
    an electroconductive first shield member that covers at least a portion of the plurality of connector pins, which are included in the connector, and that is electrically connected to the ground pattern of the wiring board; and
    an electroconductive second shield member that is disposed out of contact with the first shield member and so as to cover the plurality of connector pins including a portion of the plurality of connector pins that is not covered with the first shield member, and the second shield member being electrically connected to the housing,
    wherein the second shield member does not directly contact the ground pattern of the wiring board.

2. The portable electronic device according to claim 1, wherein the first shield member covers at least a portion of the plurality of connector pins each of which has an end connected to the wiring board, and
    the second shield member is disposed so as to cover the first shield member.

3. The portable electronic device according to claim 1, further comprising:
    an insulating member that is interposed between the first shield member and the second shield member.

4. The portable electronic device according to claim 3, wherein the first shield member is a connector shell that is included in the connector.

5. The portable electronic device according to claim 4, wherein the second shield member is pressed into contact with the housing by being sandwiched between the connector shell and the housing with the insulating member interposed between the second shield member and the connector shell.

6. The portable electronic device according to claim 1, further comprising:
    an antenna configured to perform transmission and reception of radio waves, the antenna being connected to the wiring board.

7. The portable electronic device according to claim 2, further comprising:
an insulating member that is interposed between the first shield member and the second shield member.

8. The portable electronic device according to claim 7, wherein the first shield member is a connector shell that is included in the connector.

9. The portable electronic device according to claim 8, wherein the second shield member is pressed into contact with the housing by being sandwiched between the connector shell and the housing with the insulating member interposed between the second shield member and the connector shell.

10. The portable electronic device according to claim 2, further comprising:
an antenna configured to perform transmission and reception of radio waves, the antenna being connected to the wiring board.

11. The portable electronic device according to claim 3, further comprising:
an antenna configured to perform transmission and reception of radio waves, the antenna being connected to the wiring board.

12. The portable electronic device according to claim 4, further comprising:
an antenna configured to perform transmission and reception of radio waves, the antenna being connected to the wiring board.

13. The portable electronic device according to claim 5, further comprising:
an antenna configured to perform transmission and reception of radio waves, the antenna being connected to the wiring board.

14. The portable electronic device according to claim 7, further comprising:
an antenna configured to perform transmission and reception of radio waves, the antenna being connected to the wiring board.

15. The portable electronic device according to claim 8, further comprising:
an antenna configured to perform transmission and reception of radio waves, the antenna being connected to the wiring board.

16. The portable electronic device according to claim 9, further comprising:
an antenna configured to perform transmission and reception of radio waves, the antenna being connected to the wiring board.

* * * * *